(12) United States Patent
Yuh

(10) Patent No.: US 11,676,676 B2
(45) Date of Patent: Jun. 13, 2023

(54) MERGED BIT LINES FOR HIGH DENSITY MEMORY ARRAY

(71) Applicant: Taiwan Semiconductor Manufacturing Company, Ltd., Hsinchu (TW)

(72) Inventor: Perng-Fei Yuh, Walnut Creek, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/461,898

(22) Filed: Aug. 30, 2021

(65) Prior Publication Data

US 2023/0062988 A1    Mar. 2, 2023

(51) Int. Cl.
*G11C 17/16* (2006.01)
*G11C 17/18* (2006.01)

(52) U.S. Cl.
CPC .............. *G11C 17/16* (2013.01); *G11C 17/18* (2013.01)

(58) Field of Classification Search
CPC ................................. G11C 17/18; G11C 17/16
USPC ............................................................ 365/96
See application file for complete search history.

(56) References Cited

U.S. PATENT DOCUMENTS

| | | | | |
|---|---|---|---|---|
| 7,085,184 B1* | 8/2006 | Walther | ................ | G11C 7/12 365/207 |
| 9,224,439 B2* | 12/2015 | Ramaraju | ............... | G11C 8/10 |
| 10,650,882 B2* | 5/2020 | Lin | ....... | G11C 11/419 |
| 2006/0262628 A1* | 11/2006 | Nii | ........ | G11C 11/412 365/226 |
| 2007/0103956 A1* | 5/2007 | Akiyoshi | ................ | G11C 7/18 365/230.03 |

* cited by examiner

*Primary Examiner* — Muna A Techane
(74) *Attorney, Agent, or Firm* — Foley & Lardner LLP

(57) ABSTRACT

In some aspects of the present disclosure, a memory array includes: a plurality of memory cells; and a plurality of logic gates, each of the plurality of logic gates having a first input, a second input, and an output gating a corresponding one of the plurality of memory cells, wherein the first input of each of the plurality of logic gates of a first subset is coupled to a first bit select line.

20 Claims, 8 Drawing Sheets

MERGED BIT LINES FOR HIGH DENSITY MEMORY ARRAY

BACKGROUND

Large program current and/or power may be required to burn, via Joule heat or electron migration, fuse elements in an embedded fuse (eFuse) memory macro. A fuse may be programmed by burning a fuse element from a low resistance state to a high resistance state or a complete open circuit. In some embodiments, the current a program path can provide is $I=Vp/(Rfuse+Rpara)$, where Vp is the program voltage, Rfuse is the fuse element resistance, and Rpara is the unwanted parasitic resistance that reduces the maximum current can be generated. Rpara can be dominated by the bit line resistance, the pass gate turn-on resistance, and the selector turn-on resistance, and can also include supply voltage power mesh resistance, power switch turn-on resistance, wire resistance from power switch to pass gate, ground return to pad, and all contacts and vias in the path. To deliver maximum joule power, Rfuse can be designed to be similar in value (e.g., same order of magnitude) to Rpara.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
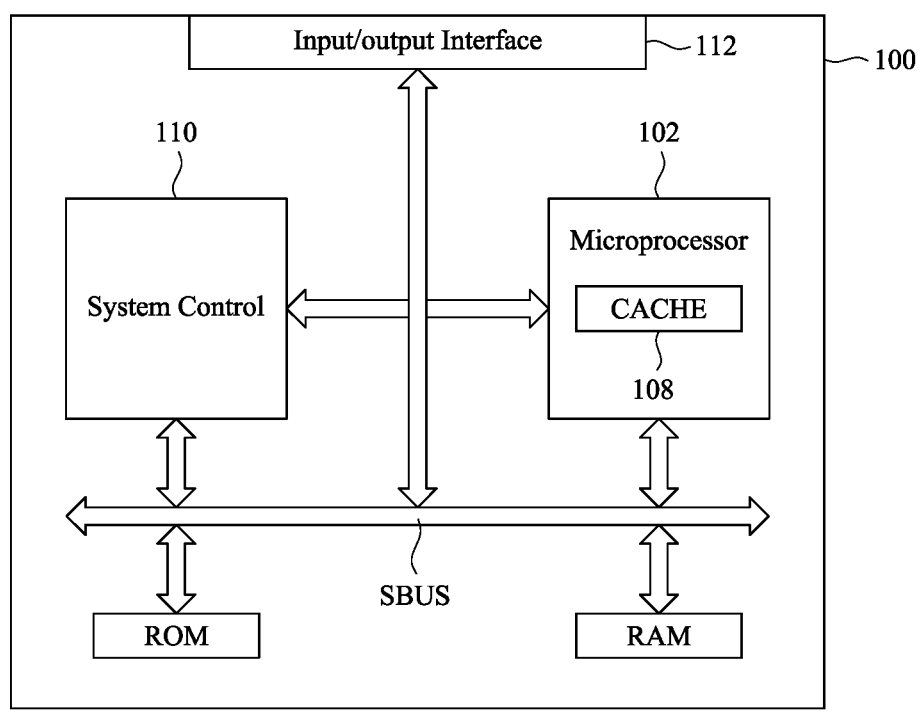
FIG. 1 illustrates a block diagram of an example of large-scale integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a memory array. In systems and methods not employing the improvements disclosed herein, eFuse may have low density (a few kilo-bits), may be large in size, and may need special high voltage for programming (writing). As technology progresses to advanced node, the eFuse scaling may become even harder because of a smaller pitch which can induce more parasitic resistance in the program path. In addition, the same high program voltage can induce more severe voltage stress on devices in the new generation. In some embodiments, the advanced node is mainly optimized for logic or SRAM process. The eFuse may suffer from uncontrolled variable process parameters, such as the various parasitic resistances, across process, voltage, and temperature.

Embodiments of the proposed array structure eliminate or reduce the resistance contribution from a pass gate and bit line by merging many bit lines and pass gates into a common bit line plane. In some embodiments, a memory array includes a plurality of memory cells and a corresponding plurality of logic gates, in which each logic gate provides a gated-word line signal to a selector gate of the corresponding memory cell. In some embodiments, the gated-word line signal is at least based on a bit line select signal and a word line signal received at the respective inputs of the logic gate.

In some embodiments, a memory system is proposed that includes a memory array and a decoder to decode a word line address and a bit line address to provide two-dimensional (2D) word lines for memory cell (e.g., bit cell) selection to the memory array. In some embodiments, the memory array is divided into multiple partitions, and each 2D word line is shared among memory cells having a same column-row position in their respective partitions.

Advantageously, the disclosed systems and methods can achieve several benefits. In one aspect, the disclosed systems and methods reduce the parasitic resistance in a memory cell program path by merging or eliminating bit lines and pass gates. Moreover, in some embodiments, the disclosed systems and methods enable a high density eFuse by reducing memory cell size. For example, after the parasitic resistance of the bit lines and the pass gates have been reduced through optimizations of the systems and methods disclosed herein, the selector transistors can be reduced in size, which causes their parasitic resistances to be increased, in order to reduce the size of the memory cells.

In addition, in some embodiments, the disclosed systems and methods enable, for the same program current, lowering the programming voltage applied to the eFuse and reducing the program path parasitic resistance. In turn, applying a lower programming voltage can protect selector transistors and pass gate transistors from breaking down under stress of a high programming voltage. Also, by lowering the programming voltage, the disclosed systems and methods can allow the programming voltage to be drawn from a standard VDD supply used by other circuits, which in turn simplifies the chip design. Moreover, in some embodiments, the disclosed systems and methods enable a larger program current with the same size of selector and the same programming voltage, which can increase the likelihood that the eFuse element burns properly. Finally, the disclosed systems and methods are more suitable for circuits using the advanced node by, for example, removing bit lines, pass gates, and the associated parasitics of each, and optimizing the voltage and the memory size. The advanced nodes have tighter design trade-offs because transistors in the advanced nodes (a) operate with lower breakdown voltages and lower supply voltage levels and (b) include more parasitics. Removing the bit lines, pass gates, and the associated parasitics relaxes these tighter design trade-offs.

FIG. 1 illustrates a block diagram of an example of large-scale integrated circuit 100, in the form of a so-called "system-on-a-chip" ("SoC"), as used in various electronic systems. Integrated circuit 100 may be a single-chip integrated circuit into which an entire computer architecture is realized. As such, in this example, integrated circuit 100 includes a central processing unit of microprocessor 102, which is connected to system bus SBUS. Various memory resources, including random access memory (RAM) 104 and read-only memory (ROM) 106, reside on system bus SBUS and are thus accessible to microprocessor 102. ROM 106 may be realized as programmable read-only memory (PROM, e.g., one-time-programmable memory), mask-programmed ROM, electrically erasable programmable read-only memory (EEPROM) such as "flash" EEPROM, or the like, and, in some embodiments, serves as program memory, storing the program instructions executable by microprocessor 102, while RAM 104 serves as data memory. In some cases, program instructions may reside in RAM 104 for recall and execution by microprocessor 102. Cache memory 108 (such as level 1, level 2, and level 3 caches, each typically implemented as SRAM) provides another memory resource and resides within microprocessor 102 itself and therefore does not require bus access. Other system functions are shown, in a generic sense, in integrated circuit 100 by way of system control 110 and input/output interface 112. In some embodiments, the disclosed system is a part of the RAM 104 or the ROM 106.

It is appreciated that integrated circuit 100 may include additional or alternative functions to those shown in FIG. 1 or may have its functions arranged according to a different architecture from that shown in FIG. 1. The architecture and functionality of integrated circuit 100 is thus provided only by way of example and is not intended to limit the scope of the present disclosure.

Figure 2:
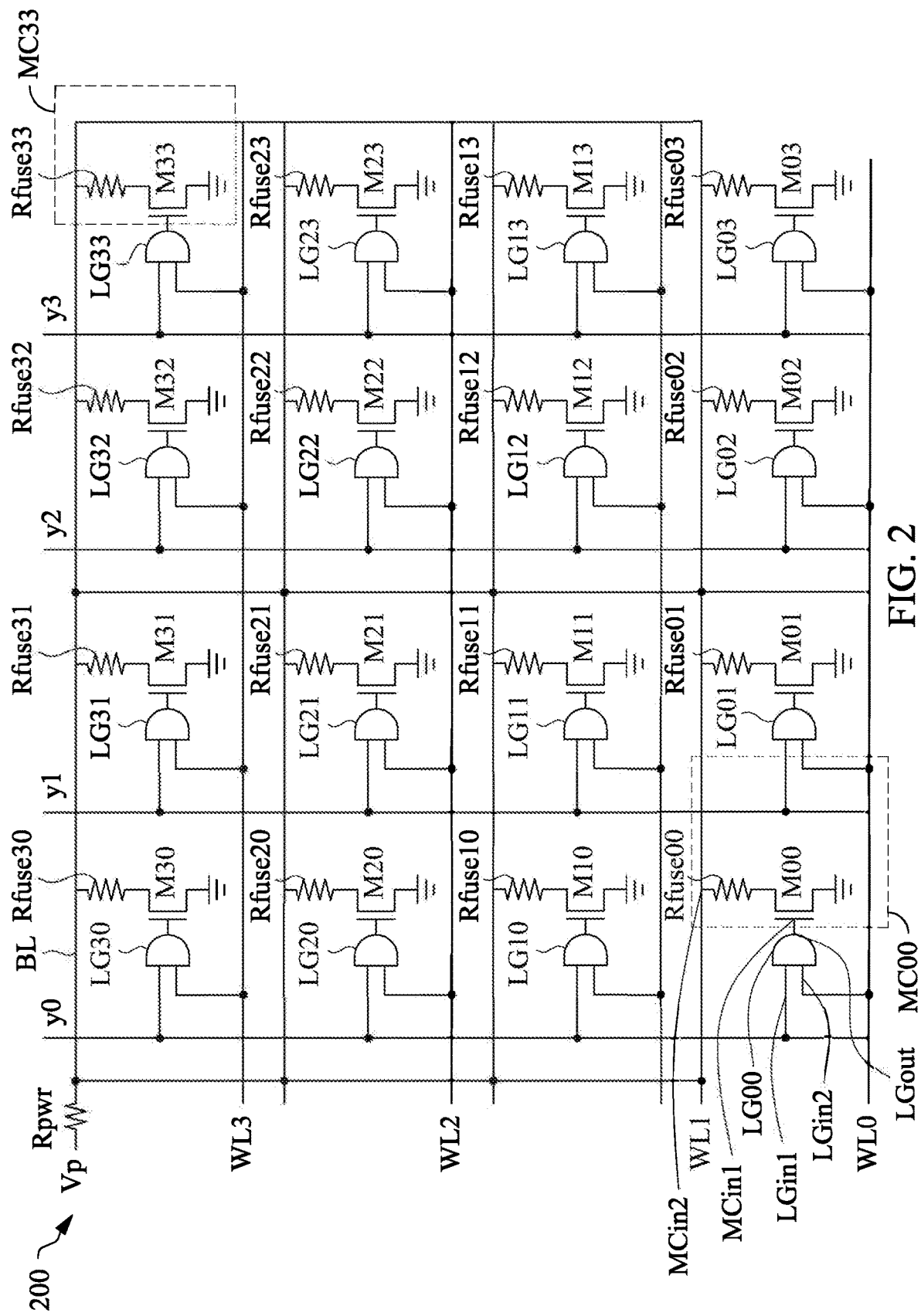
FIG. 2 illustrates a circuit diagram of a memory device, in accordance with some embodiments.

FIG. 2 illustrates a circuit diagram of a memory device 200, in accordance with some embodiments. In some embodiments, the memory device 200 is an implementation of the ROM 106 of the integrated circuit 100. The memory device (e.g., memory array) 200 includes a plurality of memory cells (MC00-MC33). In some embodiments, the plurality of memory cells MC00-MC33 is arranged in a column-row configuration. For example, a first row includes memory cells MC00-MC03, a second row includes memory cells MC10-MC13, a third row includes memory cells MC20-MC23, a fourth row includes memory cells MC30-MC33, a first column includes memory cells MC00-MC30, a second column includes memory cells MC01-MC31, a third column includes memory cells MC02-MC32, a fourth column includes memory cells MC03-MC33. Although the memory device 200 is depicted as a 4×4 array of memory cells, the memory device 200 can include any number of memory cells while remaining within the scope of the present disclosure. Each column and each row can be referred to as a subset of the memory array.

In some embodiments, each memory cell has an input (MCin1) coupled to a logic gate (LG) and an input (MCin2) coupled to a common bit line (BL). In some embodiments, the bit line BL is shared across all the memory cells MC00-MC33. That is, in some embodiments, some or all of the columns of memory cells are coupled to a single (e.g., common, merged) bit line such that there are a fewer number of bit lines than there are columns of memory cells. Each of the bit lines can be referred to as a common bit line because each bit line can be common to by to two or more columns. Each of the bit line can be referred to as a merged bit line because instead of having two bit lines coupled to two columns, respectively, the two bit lines are merged into one.

In some embodiments, each of the memory cells include a metal-oxide-semiconductor (MOS) transistor and a resistor. For example, the memory cell MC00 includes a MOS transistor M00 coupled to a resistor Rfuse00, and the memory cell MC33 includes a MOS transistor M33 coupled to a resistor Rfuse33. In that regard, in some embodiments, the memory device 200 includes a plurality of MOS transistors (e.g., M00-M33) and a corresponding plurality of resistors (e.g., Rfuse00-Rfuse33). Although the memory device 200 is depicted as a 4×4 array of MOS transistors and resistors, the memory device 200 can include any number of MOS transistors and resistors while remaining within the scope of the present disclosure. In some embodiments, in each memory cell, a gate electrode (e.g., port, terminal, node) of the MOS transistor is coupled to a corresponding logic gate, a drain electrode of the MOS transistor is coupled to a first end of the resistor, a source electrode of the MOS transistor is coupled to a first reference plane/rail (e.g., ground), and a second end of the resistor opposite the first end is coupled to the bit line BL. In some embodiments, the MOS transistor is an n-type MOS (NMOS) or a p-type MOS (PMOS). Advantageously, an NMOS does not include an n-well, which can induce the area of the memory cell to be smaller as compared to a PMOS.

The memory device 200 includes a plurality of logic gates (e.g., LG00-LG33) in which each logic gate is coupled to a corresponding memory cell. For example, LG00 is coupled to MC00. In some embodiments, the plurality of logic gates is arranged in a column-row configuration. For example, a first row includes logic gates LG00-LG03, a second row includes logic gates LG10-LG13, a third row includes logic gates LG20-LG23, a fourth row includes logic gates LG30-LG33, a first column includes logic gates LG00-LG30, a second column includes logic gates LG01-LG31, a third column includes logic gates LG02-LG32, a fourth column includes logic gates LG03-LG33. Although the memory device 200 is depicted as including a 4×4 array of logic gates, the memory device 200 can include any number of logic gates while remaining within the scope of the present disclosure.

In some embodiments, the memory cells and the corresponding logic gates are arranged in a column-row configuration in which each column has a bit select line (y) and each row has a word line (WL). In some embodiments, the bit select line (y) of each column is coupled to a plurality of logic gates that are disposed in that column, and each logic gate in that column is arranged on a different row and coupled to a respective (different) word line (WL). That is, in some embodiments, each logic gate of the memory array 200 is coupled to a bit select line of a column of memory array 200 and a WL of a row of the memory array 200. Specifically, in some embodiments, each logic gate has an input (LGin1), an input (LGin2), and an output (LGout). In some embodiments, the input LGin1 is coupled to a corresponding bit select line, the input LGin2 is coupled to a corresponding WL, and the output LGout is coupled to (e.g., gating, driving) the corresponding memory cell (e.g., a gate electrode of a MOS transistor). For example, LGin1 of LG00 is coupled to y0, LGin2 of LG30 is coupled to WL0, and LGout of LG00 is coupled to MCin1 of MC00. In some embodiments, each logic gate has a third input coupled to a discharge enable line, which is described further with respect to FIG. 4.

In some embodiments, the bit select lines are arranged in parallel vertically and the WLs are arranged in parallel horizontally (i.e., perpendicular to the bit select lines). For example, logic gates LG00-LG30 arranged along a first column are all coupled to a respective bit select line of the first column, "y0," and are each coupled to a WL of the respective row: WL0, WL1, WL2, and WL3; logic gates LG01-LG31 arranged along a second column are all coupled to a respective bit select line of the second column, "y1," and are each coupled to a WL of the respective row: WL0, WL1, WL2, and WL3; logic gates LG02-LG32 arranged along a third column are all coupled to a respective bit select line of the third column, "y2," and are each coupled to a WL of the respective row: WL0, WL1, WL2, and WL3; and logic gates LG03-LG33 arranged along a fourth column are all coupled to a respective bit select line of the fourth column, "y3," and are each coupled to a WL of the respective row: WL0, WL1, WL2, and WL3.

Each memory cell of memory array 200 is configured to store/present a data bit, or a datum. Such a data bit may be repeatedly read out from (i.e., a read operation) in each memory cell with a respective logic state (i.e., either a logical 1 or a logical 0). In some embodiments, such a data bit can be written to/programmed (i.e., a write operation) once in each memory cell with a respective logic state (i.e., either a logical 1 or a logical 0).

In some embodiments, the memory cell is programmed, e.g., by a memory controller.

For example, the memory controller applies a programming signal/voltage on the bit line BL, a word line signal on the word line corresponding to the memory cell, and a bit select signal on the bit select line corresponding to the memory cell. Based on the word line signal and bit select line signal received at its input, the logic gate provides a gated-WL signal at its output.

According to the gated-WL signal, the MOS transistor may be enabled or disabled. For example, in response to a voltage corresponding to logic state '1,' the MOS transistor MOO may be enabled to electrically couple the resistor to the first reference plane, and in response to a voltage corresponding to logic state '0,' the MOS transistor MOO may be disabled to electrically decouple the resistor to the first reference plane. In some embodiments, upon the programming signal and the gated-WL signal being applied to the memory cell, the resistor (e.g., the fuse) of the memory cell is "burned" (e.g., the impedance is changed from a first state of low impedance such as less than 100 ohms to a second state of high impedance such as greater than 100 kilo-ohms). These ranges, as well as other ranges and values, are within the scope of the disclosure. Accordingly, in some embodiments, the logic state of the memory cell is changed.

In some embodiments, the memory cell is read, e.g., by a memory controller. For example, the memory controller applies a programming signal/voltage on the word line WL, the memory controller applies a bit select signal on the bit select line, and the memory controller senses a signal/voltage on the bit line BL. In response to sensing a first signal on the bit line BL, the memory controller can determine that the memory cell is in a first state (e.g., the memory cell/eFuse has not been programmed), and in response to sensing a second signal on the bit line BL, the memory controller can determine that the memory cell is in a second state (e.g., the memory cell/eFuse has been programmed).

Figure 3:
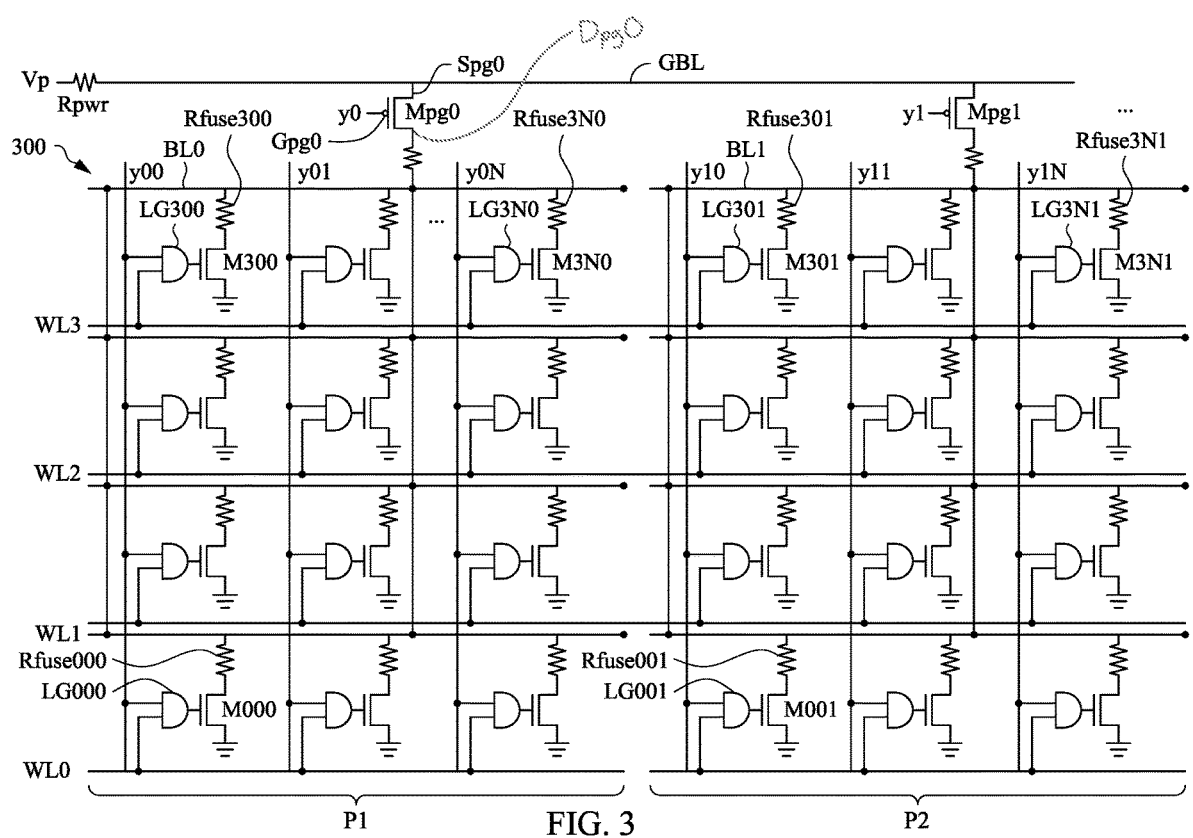
FIG. 3 illustrates a circuit diagram of another memory device, in accordance with some embodiments.

FIG. 3 illustrates a circuit diagram of a memory device 300, in accordance with some embodiments. In some embodiments, the memory device 300 is an implementation of the ROM 106 of the integrated circuit 100. In some embodiments, the memory device 300 is similar to the memory device 200 except for the following differences. The memory device 300 includes two partitions (e.g., subsets) of the memory array. Each partition of the memory array is coupled to a separate common bit line. For example, in a 4×2N memory array, the memory cells MC000-MC3N0 belong to a first partition and are coupled to a bit line BL0, and the memory cells MC001-MC3N1 belong to a second partition and are coupled to a bit line BL1. Although the memory device 300 is depicted as including a 4×2N memory array of memory cells, wherein the memory array has two partitions, the memory device 300 can include any number of memory cells and any number of partitions while remaining within the scope of the present disclosure. Each column and each row be referred to as a subset of the memory array or its partition.

In some embodiments, the logic gates of a first partition are coupled to bit select lines different from bit select lines coupled to the logic gates of a second partition. For example, in some embodiments, a first bit select line (y00) is coupled to a first logic gate (LG300) of a first partition (P1) and a second bit select line (y10) a second logic gate (LG301) of a second partition (P2), wherein the first and second logic gates are in a same row and column in their respective partitions. Although not shown in FIG. 3, in some embodiments which are within the scope of the disclosure, a same bit select line (y00) is coupled to a first logic gate (LG300) of a first partition (P1) and a second logic gate (LG301) of a second partition (P2), wherein the first and second logic gates are in a same row and column in their respective partitions.

In some embodiments, the bit line for each partition is coupled to a corresponding pass gate switch (e.g., pass gate, switch). In some embodiments, the pass gate switch is one or more of a MOS, a PMOS, or an NMOS. For example, the bit line BL0 is coupled to the pass gate switch Mpg0 and the bit line BL1 is coupled to the pass gate switch Mpg1. In some embodiments, each pass gate switch is gated (e.g., biased, controlled, driven) by a bit selection line. For example, Mpg0 is gated by bit selection line y0 and Mpg1 is gated by a bit selection line y1. In some embodiments, each pass gate switch is coupled to a global bit line (GBL). Specifically, in some embodiments, each pass gate switch includes a gate electrode, a drain electrode, and a source electrode. For example, Mpg0 includes a gate electrode Gpg0, a drain electrode Dpg0, and a source electrode Spg0. The gate electrode Gpg0 can be coupled to the corresponding bit selection line, the drain electrode Dpg0 (or the source electrode Spg0) can be coupled to the corresponding bit line, and the source electrode Spg0 (or the drain electrode Dpg0) can be coupled to the global bit line (GBL). Advantageously, by disabling (e.g., turning off) one or more pass gates switches, the one or more pass gate switches may reduce total leakage of the unselected memory cells of the memory device 300 to a leakage of the one or more pass gate switches. For example, if one pass gate switch is coupled to 100 unselected memory cells, and the one pass gate switch is disabled, the leakage amount may be reduced 100 times. Reducing leakage can ensure or reduce the likelihood that leakage current does not exceed cell current of the selected memory cell. Otherwise, if the leakage current exceeds the cell current of a selected memory cell, a memory controller may incorrectly write to or read from a selected memory cell.

Although not shown, in some embodiments within the scope of the disclosure, a bit selection bus includes each bit selection line (y0 and y1) gating the pass gate switch and each bit select line (y0-y1N) coupling to the input of the logic gate. In some embodiments, the bit selection bus provides a bit selection signal. In some embodiments, each bit select line gating the pass gate switch (y0 and y1) receives a most-significant-bit (MSB) of a bit select signal, or a combination of multiple MSBs of the bit select signal, and each bit select line (y0-ylN) gating the logic gate receives a least-significant-bit (LSB) of the bit select signal, or a combination of multiple LSBs of the bit select signal.

According to bit select signal applied through the bit select line, the pass gate switch may be enabled or disabled. For example, in response to a voltage corresponding to logic state '1' provided through the bit select line y0, the pass gate switch Mpg0 may be enabled to electrically couple the bit line BL0 to the global bit line GBL, and in response to a voltage corresponding to logic state '0' provided through the bit select line y0, the pass gate switch Mpg0 may be disabled to electrically decouple the bit line BL0 to the global bit line GBL.

Figure 4:
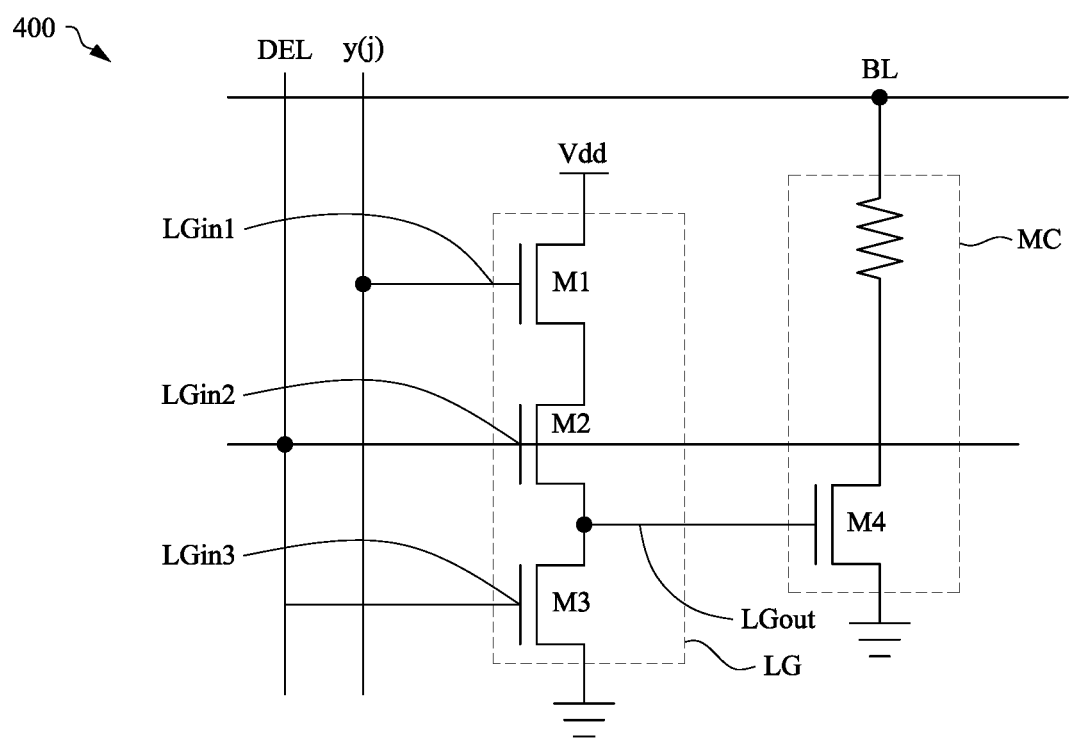
FIG. 4 illustrates a circuit diagram of a logic gate of the memory device, in accordance with some embodiments.

FIG. 4 illustrates a circuit diagram of a logic gate 400 of one or more of a memory device (e.g., one of the memory devices 200 or 300), in accordance with some embodiments. In some embodiments, the logic gate 400 is an instance of LG00 of FIG. 2. In some embodiments, the logic gate 400 includes an input LGin1, and input LGin2, an input LGin3, and an output LGout.

In some embodiments, the logic gate 400 includes a MOS transistor M1, a MOS transistor M2 coupled to the MOS transistor M1, and a MOS transistor M3 coupled to the MOS transistor M2. In some embodiments, each of the MOS transistors are an NMOS transistor. In some embodiments, at least one of the MOS transistors is a PMOS transistor. Each of the MOS transistors have a gate electrode, a drain electrode, and a source electrode.

In some embodiments, the drain electrode of M1 is coupled to a second reference plane (e.g., voltage supply line, Vdd), the gate electrode of M1 is coupled, through the input LGin1, to a bit select line y(j), and the source electrode of M1 is coupled to the drain electrode of M2. In some embodiments, the gate electrode of M2 is coupled, through the input LGin2, to a word line WL(i) and the source electrode of M2 is coupled to the drain electrode of M3. In some embodiments, the gate electrode of M3 is coupled, through the input LGin3, to a discharge enable line and the source electrode of M3 is coupled to the first reference plane (e.g., ground). In some embodiments, the source electrode of M2 and the drain electrode of M3 are coupled, through LGout, to a memory cell.

In some embodiments, in response to a voltage corresponding to logic state '1' provided through the discharge enable line DEL, M3 may be enabled to electrically couple LGout to the first reference plane, causing charge stored on LGout to be discharged to the first reference plane. In some embodiments, in response to a voltage corresponding to logic state '0' provided through the discharge enable line DEL, M3 may be disabled to electrically decouple LGout from the first reference plane. In some embodiments, in response to a voltage corresponding to logic state '1' provided through each of the bit select line y(j) and the word line WL(i), both M1 and M2 are enabled to electrically couple the second reference plane to LGout, which, in turns, enables the transistor M4 of the memory cell MC. The transistor M4 may be an instance of the transistor M00 of FIG. 2 and the memory cell MC may be an instance of the memory cell MC00 of FIG. 2.

In some embodiments, the logic gate 400 can be implemented with only NMOS transistors. In some embodiments, the logic gate 400 can be implemented with complementary MOS circuits, for example, including a CMOS NAND gate and a CMOS inverter coupled in series with the CMOS NAND gate. The CMOS NAND gate performs a NAND operation on two input signals to produce an intermediary signal. The inverter inverts the intermediary signal to produce an output signal. This is equivalent to performing an AND operation on the two input signals to produce the output signal. Any of other various implementations of the logic gate 400 are within the scope of the disclosure.

Figure 5:
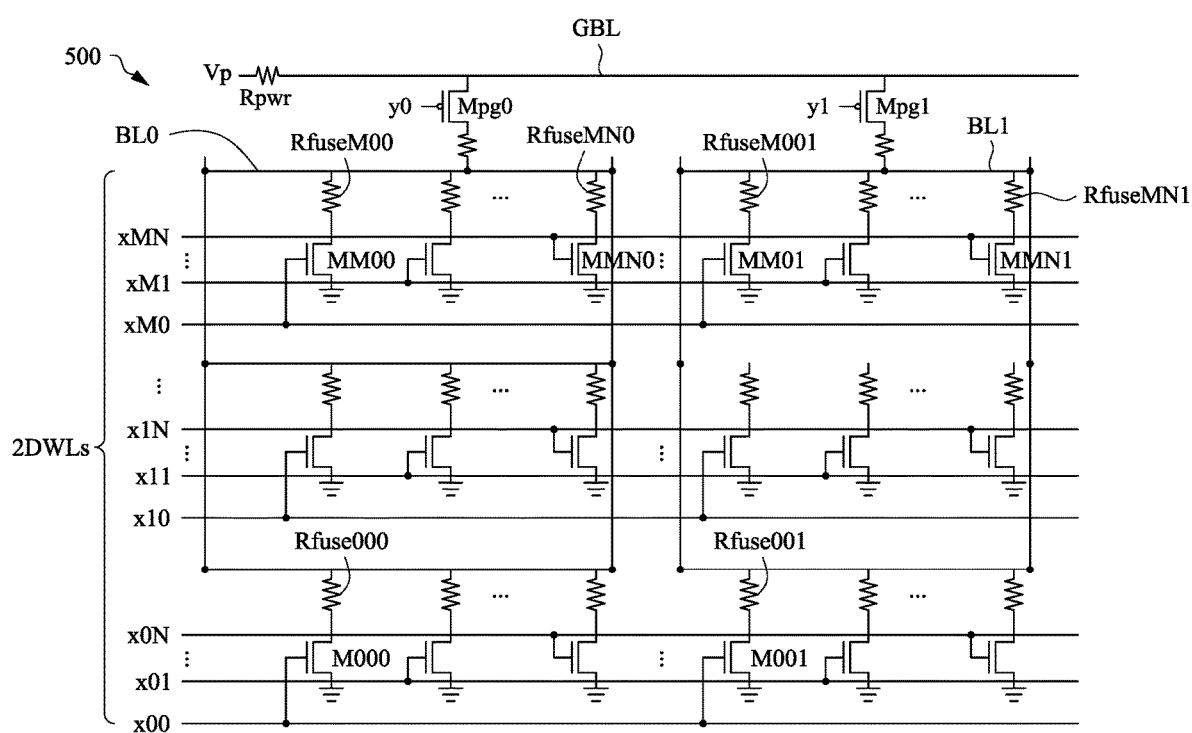
FIG. 5 illustrates a circuit diagram of yet another memory device, in accordance with some embodiments.

FIG. 5 illustrates a circuit diagram of yet another memory device 500, in accordance with some embodiments. In some embodiments, the memory device 500 of FIG. 5 is a memory device in which memory cells receive word line signals and bit line signals in a same direction. In some embodiments, the memory device 500 is an implementation of the ROM 106 of the integrated circuit 100. In some embodiments, the memory device 500 is similar to the memory device 300 except for the following differences. In some embodiments, the memory device 500 receives word line signals and bit line signals in a first direction, whereas the memory device 300 receives word line signals in a first direction and bit line signals in a second direction. Specifically, in some embodiments, the memory cells of a partition are arranged in a column-row configuration in which each intersection of a column and row has a two-dimensional (2D) word line WL. In some embodiments, the 2D WL of each row-column intersection of the partition is coupled to a memory cell that is disposed in that row-column intersection. In some embodiments, the memory device 500 includes multiple partitions in which each partition has a same column-row configuration, and the partitions share the 2D WLs. That is, in some embodiments, the 2D WL of each row-column intersection couples to each memory cell that is disposed in that row-column intersection, irrespective of which partition the memory cell is in. For example, for a memory array having two partitions, wherein each partition is an M×N array of memory cells arranged in a row-column configuration, the WL x00 couples to the memory cells MC000 and MC001, the WL x01 couples to the memory cells MC010 and MC011, etc. Although the memory device 500 is depicted as including two partitions, the memory device 500 can include any number of partitions while remaining within the scope of the present disclosure.

In some embodiments, each 2D WL is coupled to a gate electrode of a MOS transistor of the corresponding memory cells. For example, the WL x00 couples to a gate electrode of transistors M000 and M001, the WL x01 couples to a gate electrode of transistors M010 and M011. In some embodiments, each 2D WL couples directly to the gate electrode without an intervening logic gate. In some embodiments, there is no operational difference between a memory device in which each WL couples to a corresponding logic gate (e.g., the memory device 300) and a memory device in which each 2D WL couples directly to the gate electrode without an intervening logic gate (e.g., the memory device 500). That is, in some embodiments, the gated-WL signal (e.g., the signal provided by the LGout of FIG. 2) is equivalent to the 2D WL signal (e.g., the signal provided by the xMN line of FIG. 5).

Figure 6:
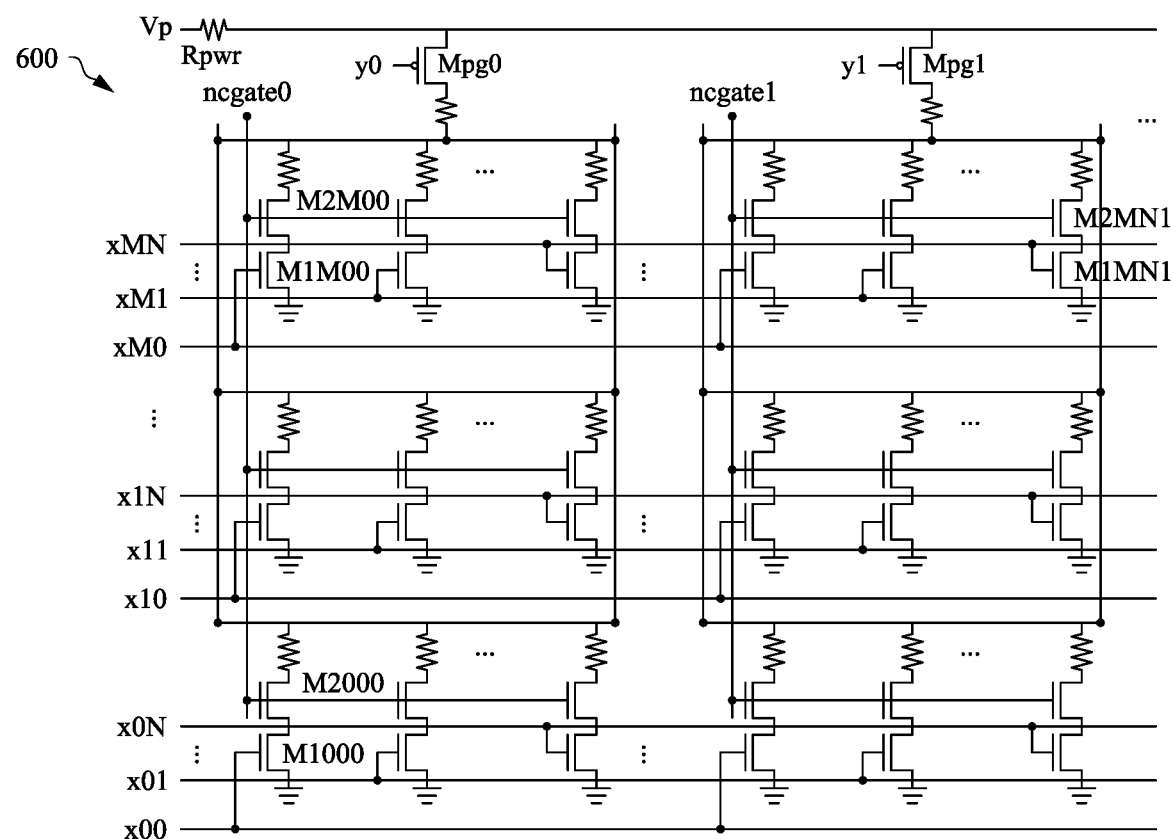
FIG. 6 illustrates a circuit diagram of yet another memory device, in accordance with some embodiments.

FIG. 6 illustrates a circuit diagram of yet another memory device 600, in accordance with some embodiments. In some embodiments, the memory device 600 is an implementation of the ROM 106 of the integrated circuit 100. In some embodiments, the memory device 600 is similar to the memory device 500 except for the following differences. In some embodiments, each memory cell includes a second MOS transistor coupled in between the MOS transistor and the resistor. For example, second transistor M2000 is coupled in between the MOS transistor M1000 and the resistor Rfuse000. Specifically, in some embodiments, the drain electrode of the second MOS transistor is coupled to one end of the resistor and the source electrode of the second MOS transistor is coupled to the drain electrode of the MOS transistor. Advantageously, the second MOS transistor can relieve the voltage stress on the MOS transistor when the memory cell is selected by absorbing a portion of the voltage drop from Vp to ground such a second portion of the voltage drop absorbed by the MOS transistor does not exceed the breakdown voltage of the MOS transistor.

In some embodiments, each second MOS transistor is gated by a bias line. In some embodiments, all of the second MOS transistors of a same partition are gated by a same bias line. For example, second MOS transistors M2000-M2MN0 are gated by a first n-cascode gate bias line (ncgate0), and second MOS transistors M2001-M2MN1 are gated by a second n-cascode gate bias line (ncgate1). Specifically, in some embodiments, the gate electrode of each second MOS transistor is coupled to the corresponding bias line.

Figure 7:
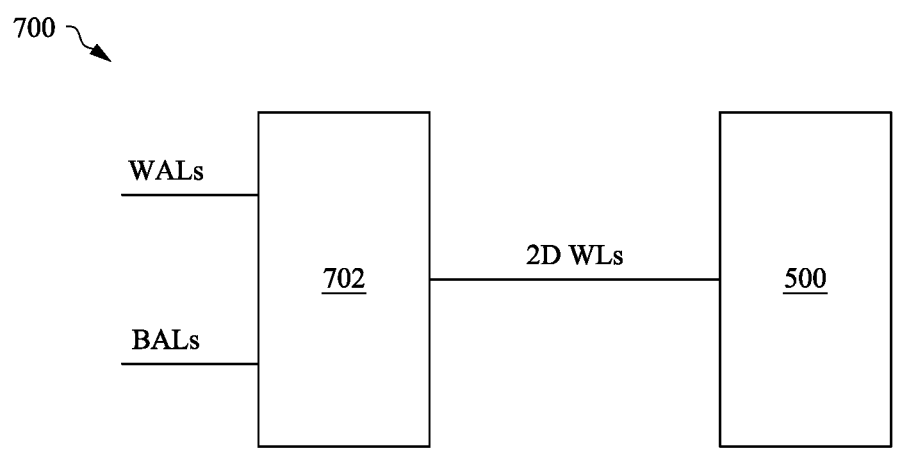
FIG. 7 illustrates a block diagram of a memory system including the memory device of FIG. 5, in accordance with some embodiments.

FIG. 7 illustrates a block diagram of a memory system 700 including the memory device 500 of FIG. 5, in accordance with some embodiments. Although the memory system 700 is depicted as including the memory device 500, the memory system 700 can include any variation of the memory device disclosed herein (e.g., the memory device 600) while remaining within the scope of the present disclosure. The memory system 700 includes a 2D WL decoder 702 coupled to the memory device 500. In some embodiments, the 2D WL decoder 702 is coupled to word address lines WALs at a first input, bit address lines BALs at a second input, and 2D WLs at an output, wherein the 2D WLs are coupled to corresponding memory cells of the memory device 500. The WALs apply a word address signal which encodes the word line signals and the BALs apply a bit address signal encodes the bit select signals. In some embodiments, the 2D WL decoder 702 decodes the WALs and the BALs to produce the 2D WLs similarly to how a conventional row decoder decodes a word line address to produce word lines. In some embodiments, the 2D WL decoder 702 includes logic gates arranged to enable decoding of the WALs and the BALs.

Figure 8:
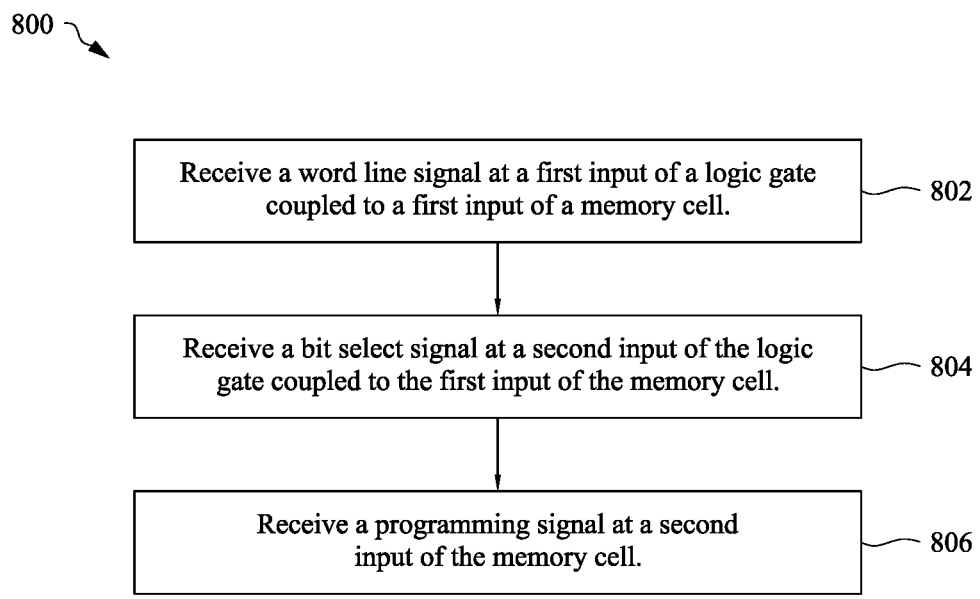
FIG. 8 illustrates a flow chart of an example method of programming a memory device, in accordance with various embodiments.

FIG. 8 illustrates a flow chart of an example method 800 of programming a memory device, in accordance with various embodiments. In some embodiments, the method is performed by the memory device (e.g., one of the memory devices 200, 300, 500, or 600). As such, the following embodiment of the method 800 will be described in conjunction with FIGS. 1-7. The illustrated embodiment of the method 800 is merely an example. Therefore, it shall be understood that any of a variety of the operations of the method 800 may be omitted, re-sequenced, and/or added while remaining within the scope of the present disclosure.

The method 800 starts with operation 802 of receiving a word line signal, through a word line (e.g., WL0 of FIG. 2), at a first input (e.g., LGin2 of FIG. 2) of a logic gate (e.g., LG00 of FIG. 2) coupled to a first input (e.g., MCin1 of FIG. 2) of a memory cell (e.g., MC00 of FIG. 2), in accordance with various embodiments. The method 800 continues to operation 804 of receiving a bit select signal, through a bit select line (e.g., y0 of FIG. 2), at a second input (e.g., LGin1 of FIG. 2) of the logic gate coupled to the first input of the memory cell, in accordance with various embodiments. In some embodiments, the word line signal and the bit select signal are combined in the logic gate to provide a gated-word line signal at the first input of the memory cell. In some embodiments, the method 800 includes receiving a discharge signal at a third input (e.g., LGin3 of FIG. 4) of the logic gate, causing charge to be discharged from the memory cell to ground. In some embodiments, the method 800 includes receiving a second discharge signal at the third input of the logic gate, causing the charge to no longer be discharged from the memory cell to ground. In some embodiments, operations 802 and 804 are responsive to receiving the second discharge signal.

The method 800 continues to operation 806 of receiving a programming signal, through a bit line (e.g., BL of FIG. 2), at a second input (e.g., MCin2 of FIG. 2) of the memory cell, in accordance with various embodiments. In some embodiments, a current is applied through a resistor (e.g., Rfuse00 of FIG. 2) in the memory cell causing a logic state of the resistor to change as a result of operations 802, 804, and 806. In some embodiments, the method 800 includes receiving a second bit select signal at an input of a pass gate switch (e.g., Mpg0 of FIG. 3) to electrically couple a global bit line (e.g., GBL of FIG. 3) connected to a source electrode (e.g., Spg0 of FIG. 3) of the pass gate switch to the bit line connected to a drain electrode (e.g., Dpg0 of FIG. 3) of the pass gate switch. In some embodiments, operation 806 is responsive to receiving the second bit select signal.

In some embodiments, the method 800 can be performed by a memory controller (e.g., the integrated circuit 100). In some embodiments, the memory controller applies a word line signal, through a word line, at a first input of a logic gate coupled to a first input of a memory cell. In some embodiments, the memory controller applies a bit select signal, through a bit select line, at a second input of the logic gate coupled to the first input of the memory cell. In some embodiments, the memory controller applies a programming signal, through a bit line, at a second input of the memory cell.

In some aspects, a memory array includes: a plurality of memory cells; and a plurality of logic gates, each of the plurality of logic gates having a first input, a second input, and an output gating a corresponding one of the plurality of memory cells, wherein the first input of each of the plurality of logic gates of a first subset is coupled to a first bit select line. In some aspects, the first input of each of the plurality of logic gates of a second subset is coupled to a second bit select line.

In some aspects, each of a first memory cell subset gated by the output of a corresponding one of the first subset of the plurality of logic gates and each of a second memory cell subset gated by the output of a corresponding one of the second subset of logic gates is coupled to a same bit line. In some aspects, each of a first memory cell subset gated by the output of a corresponding one of the first subset of the plurality of logic gates is coupled to a first bit line and each of a second memory cell subset gated by the output of a corresponding the second subset of the plurality of logic gates is coupled to a second bit line.

In some aspects, the first bit line is coupled to a first switch gated by a third bit select line and the second bit line is coupled to a second switch gated by a fourth bit select line. In some aspects, each second input of a second subset of the plurality of logic gates is coupled to a first word line, the second subset includes a first logic gate of the first subset of the plurality of logic gates and a second logic gate not belonging to the first subset of the plurality of logic gates.

In some aspects, each of the plurality of memory cells includes a metal-oxide-semiconductor (MOS) transistor coupled to resistor. In some aspects, a gate electrode of the MOS transistor is coupled to the output of the logic gate, a drain electrode of the MOS transistor is coupled to a first end of the resistor, and a second end of the resistor is coupled to a bit line.

In some aspects, each of the plurality of logic gates includes a first n-type metal-oxide-semiconductor (NMOS) transistor connected in series with a second NMOS transistor connected in series with a third NMOS transistor, the second NMOS transistor and the third NMOS transistor are gating a corresponding one of the plurality of memory cells. In some aspects, the first NMOS transistor is gated by the first input, the second NMOS transistor is gated by the second input, and the third NMOS transistor is gated by a discharge enable line.

In some aspects, a memory array system includes: a decoder having a first input coupled to a plurality of bit address lines, a second input coupled to a plurality of word address lines, and an output coupled to a plurality of two-dimensional (2D) word lines at least based on the plurality of bit address lines and the plurality of word address lines; and a plurality of memory cells, wherein each of the plurality of memory cells is coupled to a corresponding 2D word line.

In some aspects, the plurality of memory cells are arranged in a plurality of rows and a plurality of columns, the plurality of rows are disposed in a first direction and the plurality of columns are disposed in a second direction, and each of the plurality of memory cells is coupled to the corresponding 2D word line in the first direction. In some aspects, a first subset of the plurality of memory cells is coupled to a first bit line and a second subset of the plurality of memory cells is coupled to a second bit line.

In some aspects, the first bit line is coupled to a first switch gated by a first bit select line and the second bit line is coupled to a second switch gated by a second bit select line. In some aspects, a third subset of the plurality of memory cells is coupled to a third bit line and a fourth subset of the plurality of memory cells is coupled to a fourth bit line. In some aspects, the first bit line is coupled to a first switch gated by a first bit select line and the second bit line is coupled to a second switch gated by a second bit select line, the third bit line is coupled to a third switch gated by a third bit select line and the fourth bit line is coupled to a fourth switch gated by a fourth bit select line.

In some aspects, each of the plurality of memory cells includes a metal-oxide-semiconductor (MOS) transistor coupled to resistor. In some aspects, each of the plurality of memory cells includes a second MOS transistor coupled in between the MOS transistor and the resistor, a bias line is gating the second MOS transistor. In some aspects, the bias is coupled to a switch gated by a bit line.

In some aspects, a method for programming a memory cell includes: receiving a word line signal at a first input of a logic gate coupled to a first input of a memory cell; receiving a bit select signal at a second input of the logic gate coupled to the first input of the memory cell; and receiving a programming signal at a second input of the memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:
    a plurality of memory cells; and
    a plurality of logic gates, each of the plurality of logic gates having a first input, a second input, and an output that is coupled to a corresponding one of the plurality of memory cells, wherein the first input of each of the plurality of logic gates of a first subset is coupled to a first bit select line.

2. The memory array of claim 1, wherein the first input of each of the plurality of logic gates of a second subset is coupled to a second bit select line.

3. The memory array of claim 2, wherein each of a first memory cell subset gated by the output of a corresponding one of the first subset of the plurality of logic gates and each of a second memory cell subset gated by the output of a corresponding one of the second subset of logic gates is coupled to a same bit line.

4. The memory array of claim 2, wherein each of a first memory cell subset gated by the output of a corresponding one of the first subset of the plurality of logic gates is coupled to a first bit line and each of a second memory cell subset gated by the output of a corresponding the second subset of the plurality of logic gates is coupled to a second bit line.

5. The memory array of claim 4, wherein the first bit line is coupled to a first switch gated by a third bit select line and the second bit line is coupled to a second switch gated by a fourth bit select line.

6. The memory array of claim 1, wherein each second input of a second subset of the plurality of logic gates is coupled to a first word line, wherein the second subset includes a first logic gate of the first subset of the plurality of logic gates and a second logic gate not belonging to the first subset of the plurality of logic gates.

7. The memory array of claim 1, wherein each of the plurality of memory cells includes a metal-oxide-semiconductor (MOS) transistor coupled to a resistor.

8. The memory array of claim 7, wherein a gate electrode of the MOS transistor is coupled to the output of the logic gate, a drain electrode of the MOS transistor is coupled to a first end of the resistor, and a second end of the resistor is coupled to a bit line.

9. The memory array of claim 1, wherein each of the plurality of logic gates includes a first n-type metal-oxide-semiconductor (NMOS) transistor connected in series with a second NMOS transistor connected in series with a third NMOS transistor, wherein the second NMOS transistor and the third NMOS transistor are gating a corresponding one of the plurality of memory cells.

10. The memory array of claim 9, wherein the first NMOS transistor is gated by the first input, the second NMOS transistor is gated by the second input, and the third NMOS transistor is gated by a discharge enable line.

11. The memory array of claim 6, further comprising:
a decoder including the plurality of logic gates, wherein the output is coupled to the corresponding one of the plurality of memory cells via a corresponding two-dimensional (2D) word line of a plurality of 2D word lines.

12. The memory array of claim 11, wherein the plurality of memory cells are arranged in a plurality of rows and a plurality of columns, wherein the plurality of rows are disposed in a first direction and the plurality of columns are disposed in a second direction, and wherein each of the plurality of memory cells is coupled to the corresponding 2D word line in the first direction.

13. The memory array of claim 11, wherein a first subset of the plurality of memory cells is coupled to a first bit line and a second subset of the plurality of memory cells is coupled to a second bit line.

14. The memory array of claim 13, wherein the first bit line is coupled to a first switch gated by a first bit select line and the second bit line is coupled to a second switch gated by a second bit select line.

15. The memory array of claim 13, wherein a third subset of the plurality of memory cells is coupled to a third bit line and a fourth subset of the plurality of memory cells is coupled to a fourth bit line.

16. The memory array of claim 15, wherein the first bit line is coupled to a first switch gated by a first bit select line and the second bit line is coupled to a second switch gated by a second bit select line, the third bit line is coupled to a third switch gated by a third bit select line and the fourth bit line is coupled to a fourth switch gated by a fourth bit select line.

17. The memory array of claim 11, wherein each of the plurality of memory cells includes a metal-oxide-semiconductor (MOS) transistor coupled to a resistor.

18. The memory array of claim 17, wherein each of the plurality of memory cells includes a second MOS transistor coupled in between the MOS transistor and the resistor, wherein a bias line is gating the second MOS transistor.

19. The memory array of claim 18, wherein the bias is coupled to a switch gated by a bit line.

20. A method for programming a memory cell comprising:
receiving a word line signal at a first input of a logic gate, the logic gate being coupled to a first input of a memory cell;
receiving a bit select signal at a second input of the logic gate; and
receiving a programming signal at a second input of the memory cell.

* * * * *